(12) United States Patent
Kondo et al.

(10) Patent No.: US 9,627,853 B2
(45) Date of Patent: *Apr. 18, 2017

(54) EXTERNAL RESONATOR-TYPE LIGHT EMITTING DEVICE

(71) Applicant: NGK INSULATORS, LTD., Aichi-prefecture (JP)

(72) Inventors: Jungo Kondo, Miyoshi (JP); Shoichiro Yamaguchi, Ichinomiya (JP); Takashi Yoshino, Ama (JP); Yukihisa Takeuchi, Nagoya (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/958,241

(22) Filed: Dec. 3, 2015

(65) Prior Publication Data

US 2016/0087405 A1 Mar. 24, 2016

Related U.S. Application Data

(63) Continuation of application No. PCT/JP2014/064808, filed on Jun. 4, 2014.

(30) Foreign Application Priority Data

Jun. 7, 2013 (JP) .................. 2013-120999

(51) Int. Cl.
*H01S 5/125* (2006.01)
*H01S 5/14* (2006.01)
(Continued)

(52) U.S. Cl.
CPC .............. *H01S 5/125* (2013.01); *G02B 6/124* (2013.01); *H01S 5/02252* (2013.01);
(Continued)

(58) Field of Classification Search
CPC ........ H01S 5/141; H01S 5/1039; H01S 5/125; H01S 5/146; H01S 5/02248
See application file for complete search history.

(56) References Cited

U.S. PATENT DOCUMENTS 5,870,417 A 2/1999 Verdiell et al.
5,914,972 A 6/1999 Siala et al.
(Continued)

FOREIGN PATENT DOCUMENTS

EP 1283571 A1 8/2001
JP 49-128689 A 12/1974
(Continued)

OTHER PUBLICATIONS

Tanaka, "Hybrid-Integrated External-Cavity Laser without Temperature-Dependent Mode Hopping" 2002, Journal of lightwave Technology, vol. 20, No. 9, pp. 1730-1739.*

(Continued)

*Primary Examiner* — Michael Carter
(74) *Attorney, Agent, or Firm* — Cermak Nakajima & McGowan LLP; Tomoko Nakajima

(57) ABSTRACT

An external resonator type light emitting system includes a light source oscillating a semiconductor laser light and a grating device providing an external resonator with the light source. The light source includes an active layer oscillating the semiconductor laser light. The grating device includes an optical waveguide having an incident face to which the semiconductor laser is incident and an emitting face of emitting an emitting light of a desired wavelength, a Bragg grating formed in the optical waveguide, and a propagating portion provided between the incident face and the Bragg grating. Formulas (1) to (4) are satisfied.

12 Claims, 11 Drawing Sheets

(51) Int. Cl.
*H01S 5/022* (2006.01)
*H01S 5/10* (2006.01)
*G02B 6/124* (2006.01)
*H01S 5/028* (2006.01)

(52) U.S. Cl.
CPC ............ *H01S 5/1039* (2013.01); *H01S 5/141* (2013.01); *H01S 5/0287* (2013.01)

(56) References Cited

U.S. PATENT DOCUMENTS

| | | | |
|---|---|---|---|
| 5,937,120 | A | 8/1999 | Higashi |
| 6,567,447 | B1 | 5/2003 | Yoshida et al. |
| 6,580,734 | B1 | 6/2003 | Zimmermann |
| 6,614,822 | B2 | 9/2003 | Yoshida et al. |
| 6,952,437 | B1 | 10/2005 | Bettiati et al. |
| 7,424,044 | B2 | 9/2008 | Zheng et al. |
| 7,776,634 | B2 | 8/2010 | Reithmaier et al. |
| 8,867,577 | B2 | 10/2014 | Fukaya et al. |
| 9,184,564 | B2 | 11/2015 | Kondo et al. |
| 2001/0021210 | A1 | 9/2001 | Nakaya et al. |
| 2001/0046250 | A1 | 11/2001 | Arbel et al. |
| 2003/0081646 | A1 | 5/2003 | Bacher |
| 2004/0020893 | A1 | 2/2004 | Drake et al. |
| 2004/0047390 | A1 | 3/2004 | Sverdlov et al. |
| 2004/0105480 | A1 | 6/2004 | Sidorin et al. |
| 2004/0264514 | A1 | 12/2004 | Kim |
| 2005/0018741 | A1 | 1/2005 | Nomaguchi |
| 2006/0030842 | A1* | 2/2006 | Brandenburg ......... B82Y 20/00 606/4 |
| 2007/0127538 | A1 | 6/2007 | Lee et al. |
| 2010/0014545 | A1 | 1/2010 | Lee et al. |
| 2010/0232458 | A1 | 9/2010 | Kim et al. |
| 2011/0205661 | A1* | 8/2011 | Komura ................ B82Y 20/00 360/59 |
| 2012/0099611 | A1 | 4/2012 | Kim et al. |
| 2015/0147020 | A1 | 5/2015 | Kondo et al. |

FOREIGN PATENT DOCUMENTS

| | | |
|---|---|---|
| JP | 56-148880 A | 11/1981 |
| JP | 1-201983 A | 8/1989 |
| JP | 05-060927 A | 3/1993 |
| JP | 10-98230 A | 4/1998 |
| JP | 11-330598 A | 11/1999 |
| JP | 2000-082864 A | 3/2000 |
| JP | 2001-272559 A | 10/2001 |
| JP | 2002-050827 A | 2/2002 |
| JP | 2002-134833 A | 5/2002 |
| JP | 2002-374037 A | 12/2002 |
| JP | 2003-110193 A | 4/2003 |
| JP | 2006-222399 A | 8/2006 |
| JP | 2009-529782 A | 8/2009 |
| JP | 2010-171252 A | 8/2010 |
| JP | 2010171252 * | 8/2010 |
| JP | 2013-140225 A | 7/2013 |
| WO | WO2013/034813 A2 | 3/2013 |
| WO | WO2015/079939 A1 | 6/2015 |
| WO | WO2015/079986 A1 | 6/2015 |

OTHER PUBLICATIONS

International Search Report and Written Opinion for PCT Patent App. No. PCT/JP2014/064808 (Aug. 12, 2014) with English translation of the Search Report.

Office Action from Japanese Patent App. No. 2015-514679 (Nov. 4, 2015).

Tanaka, T., et al., "Hybrid-Integrated External-Cavity Laser Without Temperature-Dependent Mode Hopping", J. Lightwave Technol. 2002;20(9):1730-1739.

European Search Report for European Patent App. No. 14171514.4 (May 12, 2015).

Office Action from co-pending U.S. Appl. No. 14/258,212 (Feb. 6, 2015).

Zheng, Y., et al., "High-brightness narrow-bandwidth High-power laser-diode array based on an external -cavity technique," Technical Reports on Fundamentals of Electronics, Communications and Computer Sciences, LQE, 2005, vol. 105, No. 52, pp. 17-20.

International Preliminary Report on Patentability for PCT Patent App. No. PCT/JP2014/064808 (Dec. 17, 2015).

* cited by examiner

EXTERNAL RESONATOR-TYPE LIGHT EMITTING DEVICE

BACKGROUND OF THE INVENTION

Field of the Invention

The present invention relates to an external resonator type light emitting system.

Related Art Statement

It has been generally utilized a semiconductor laser of Fabry-Perot (FP) type including an optical resonator constructed with an active layer and mirrors provided on both end faces of the active layer. However, according to such FP type laser, light is oscillated at a wavelength satisfying conditions for oscillating standing waves. The longitudinal mode thus tends to be of multi mode, and the oscillating wavelength is changed particularly when a current or temperature is changed, resulting in a change of optical intensity.

Therefore, for the purpose of optical communication or gas sensing, it is required a laser capable of single mode oscillation and with good stability of wavelength. It has been thereby developed a distributed feed-back (DFB) laser and a distributed reflection (DBR) laser. According to these laser systems, diffraction gratings are provided in a semiconductor material to oscillate light having only a specific wavelength utilizing the dependency of the gratings on wavelength.

According to the DBR laser, concaves and convexes are formed on a surface of a waveguide extended from a waveguide of the active layer to provide a mirror utilizing Bragg reflection for realizing a resonator (Patent Document 1; Japanese Patent Publication No. S49-128,689A; Japanese Patent Document 2; Japanese patent Publication No. S56-148,880A). Since diffraction gratings are provided on both ends of the optical waveguide layer according to the laser, light emitted from the active layer is propagated through the optical waveguide layer, and a part of the propagating light is reflected by the diffraction gratings, returned into a current injection part and then amplified. As light component having only a single wavelength is reflected at a specific direction from the diffraction grating, the wavelength of the laser light is made constant.

Further, as the application, it was developed an external resonator type semiconductor laser including a diffraction grating as a part separated from the semiconductor to form an external resonator. Such type of laser provides one having stability of wavelength, stability of temperature and controllability. The external resonator includes a fiber Bragg grating (FBG) (Non-patent document 1) and a volume hologram grating (VHG) (Non-patent document 2). Since the diffraction grating is composed of a member separated from the semiconductor laser, it is characteristic that its reflectance and length of the resonator can be independently designed. And, since it does not affected by elevation of temperature rise due to heat generation caused by current injection, it is possible to further improve the stability on wavelength. Further, the temperature dependency of refractive index of the semiconductor is different, it is possible to improve the stability on temperature can be improved by designing the refractive index together with the length of the resonator.

According to Japanese Patent document 6 (Japanese Patent Publication No. 2002-134,833A), it is disclosed an external resonator type laser utilizing a grating formed in a waveguide composed of quartz glass. It aims at providing a frequency-stable laser suitably used in environment under which room temperature is considerably changed, (for example, up to 30° C. or higher) without a temperature controller. It is further described to provide a laser free from temperature dependency with mode hopping prevented and without dependency of oscillating frequency on temperature.

PRIOR ARTS (Non-Patent document 1) "Transactions on Fundamentals of Electronics, Communications and Computer Sciences" C-II Vol. J81, No. 7 pp. 664-665, 1998 July (Non Patent document 2) "Technical Reports on Fundamentals of Electronics, Communications and Computer Sciences" LQE, 2005, Vol 105, No. 52, pp. 17-20

(Patent document 1) Japanese Patent Publication No. S49-128,689A (Patent document 2) Japanese Patent Publication No. S56-148,880A (Patent document 3) WO 2013/034,813

(Patent document 4) Japanese Patent Publication No. 2000-082,864A (Patent document 5) Japanese Patent Publication No. 2006-222,399A (Patent document 6) Japanese patent Publication No. 2002-134,833A

SUMMARY OF THE INVENTION

The non-patent document 1 refers to the mechanism of mode hopping deteriorating stability on wavelength accompanied with temperature rise and a method of solving it. An amount $\delta\lambda s$ of change of wavelength of an external resonator type laser depending on temperature is expressed as the following formula based on standing wave condition, provided that $\Delta na$ is assigned to a change of refractive index of active layer region of a semiconductor, La is assigned to a length of the active layer, $\Delta nf$ and Lf are assigned to a change of refractive index and length, respectively, of FBG region, and $\delta Ta$ and $\delta Tf$ are assigned to changes of temperatures of them, respectively.

$$\delta\lambda_s = \lambda_0 \frac{\Delta n_a L_a}{n_f L_f + n_a L_a} \delta T_a + \lambda_0 \frac{\Delta n_f L_f}{n_f L_f + n_a L_a} \delta T_f \quad \text{Formula (A)}$$

Here, $\lambda 0$ represents a wavelength of reflection by a grating at initial stage.

Further, a change $\delta\lambda G$ of a wavelength of reflection of the grating is represented according to the following formula.

$$\delta\lambda_G = \lambda_0 \frac{\Delta n_f}{n_f} \delta T_f \quad \text{Formula (B)}$$

Mode hopping is caused when a longitudinal mode spacing $\Delta\lambda$ of the external resonator equals to a difference between the amount of change of wavelength $\delta\lambda s$ and amount $\delta\lambda G$ of change of reflection wavelength of the grating, so that the following formula is satisfied.

$$\Delta\lambda = \delta\lambda_s - \lambda_0 \frac{\Delta n_f}{n_f} \delta T_f \quad \text{Formula (C)}$$

The longitudinal mode spacing Δλ is represented approximately according to the following formula.

$$\Delta\lambda = \frac{\lambda_0^2}{2(n_f L_f + n_a L_a)} \quad \text{Formula (D)}$$

Formula (E) is satisfied based on the formulas (C) and (D).

$$\Delta T_{all} = \frac{\lambda_0}{2 n_a L_a \left( \frac{\Delta n_a}{n_a} - \frac{\Delta n_f}{n_f} \right)} \quad \text{Formula (E)}$$

For preventing the mode hopping, it is necessary to use within a temperature range smaller than ΔTall, so that the temperature is controlled by using a Pertier device. According to the formula (E), in the case that the changes of the reflective indices of the active layer and grating layer are the same (Δna/na=Δnf/nf), the denominator becomes zero and the temperature for causing the mode hopping becomes infinite value, indicating that the mode hopping would not occur. According to a monolithic type DBR laser, however, since current is injected into the active layer for laser oscillation, the changes of the refractive indices of the active layer and grating layer cannot be matched with each other, resulting in the mode hopping.

The mode hopping is the phenomenon that the oscillating mode (longitudinal mode) within the resonator is shifted from one mode to another mode. As the temperature or injection current is changed, the conditions of the gain and resonator are changed and the wavelength of the oscillated laser is thereby changed, resulting in the problem, called kink, that the optical power is deviated. In the case of an FP type GaAs semiconductor laser, therefore, the wavelength is normally changed at a temperature coefficient of 0.3 nm/° C., and more considerable deviation would occur when the mode hopping takes place. At the same time, the output is changed by 5 percent or more.

Therefore, for preventing the mode hopping, a Pertier device is used for controlling the temperature. A number of parts are thereby increased, the size of a module is enlarged and its cost is made high.

According to the patent document 6, for preventing the dependency on temperature, the structure of a prior resonator itself is maintained and a stress is applied on an optical waveguide layer to compensate a temperature coefficient due to the thermal expansion to realize the non-dependency on temperature. Therefore, a metal plate is adhered onto the device and it is further added a layer of adjusting the temperature coefficient within the waveguide. There is a problem that the resonator structure is further enlarged.

An object of the present invention is to reduce the mode hopping, to improve the stability on wavelength and to reduce the deviation of an optical power, without using a Peltier device.

The present invention provides an external resonator type light emitting system comprising a light source oscillating a semiconductor laser light and a grating device providing an external resonator with the light source;

wherein the light source comprises an active layer oscillating the semiconductor laser light;

wherein the grating device comprises an optical waveguide comprising an incident face for making the semiconductor laser light incident and an emitting face of emitting an emitting light having a desired wavelength, a Bragg grating formed in the optical waveguide, and a propagating portion provided between the incident face and the Bragg grating; and wherein the following formulas (1) to (4) are satisfied.

$$\Delta\lambda_G \geq 0.8 \text{ nm} \quad (1)$$

$$L_b \leq 500 \text{ μm} \quad (2)$$

$$L_a \leq 500 \text{ μm} \quad (3)$$

$$n_b \geq 1.8 \quad (4)$$

(Δλ$_G$ represents a full width at half maximum of a peak of a Bragg reflectance in the formula (1).

$L_b$ represents a length of the Bragg grating in the formula (2).

$L_a$ represents a length of the active layer in the formula (3).

$n_b$ represents a refractive index of a material forming the Bragg grating in the formula (4).)

According to a preferred embodiment, the relationship of the following formula (5) is further satisfied.

$$\left| \frac{d\lambda_G}{dT} - \frac{d\lambda_{TM}}{dT} \right| \leq 0.03 \text{ nm/° C.} \quad (5)$$

(dλ$_G$/dT represents a temperature coefficient of a Bragg wavelength, and dλ$_{TM}$/dT represents a temperature coefficient of a wavelength satisfying a phase condition of an external resonator laser in the formula (5).)

According to a preferred embodiment, the following formulas (6) to (8) are satisfied.

$$L_{WG} \leq 600 \text{ μm} \quad (6)$$

$$1 \text{ μm} \leq L_g \leq 10 \text{ μm} \quad (7)$$

$$20 \text{ μm} \leq L_m \leq 100 \text{ μm} \quad (8)$$

($L_{WG}$ represents a length of the grating device in the formula (6).

$L_g$ represents a distance between an emitting face of the light source and the incident face of the optical waveguide layer in the formula (7).

$L_m$ represent a length of the propagating portion in the formula (8).)

According to the present invention, it is possible to reduce the mode hopping, to improve the stability on wavelength and to reduce the deviation of the optical power without the use of a Peltier device.

EMBODIMENTS OF THE INVENTION

Figure 1:
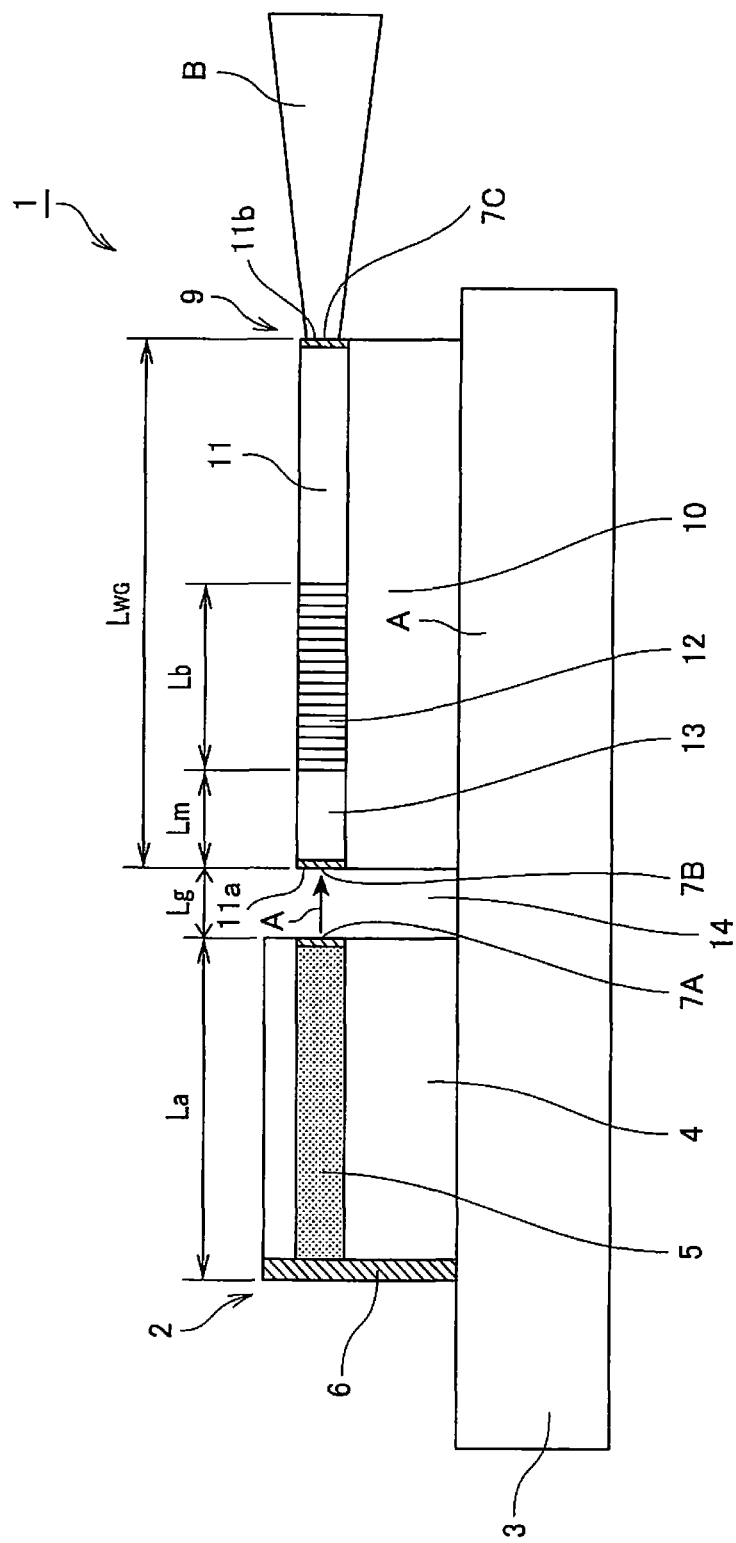
FIG. 1 is a view schematically showing an external resonator type light emitting system.

An external resonator type light emitting system 1, schematically shown in FIG. 1, includes a light source 1 oscillating a semiconductor laser light, and a grating device 9. The light source 2 and grating device 9 are mounted on a common mount 3.

The light source 2 includes an active layer 5 oscillating the semiconductor laser light. According to the present embodiment, the active layer 5 is provided on a substrate 4. A reflection film 6 is provided on an outer end face of the substrate 4, and a antireflection layer 7A is formed on an end face of the active layer 5 on the side of the grating device.

Figure 3:
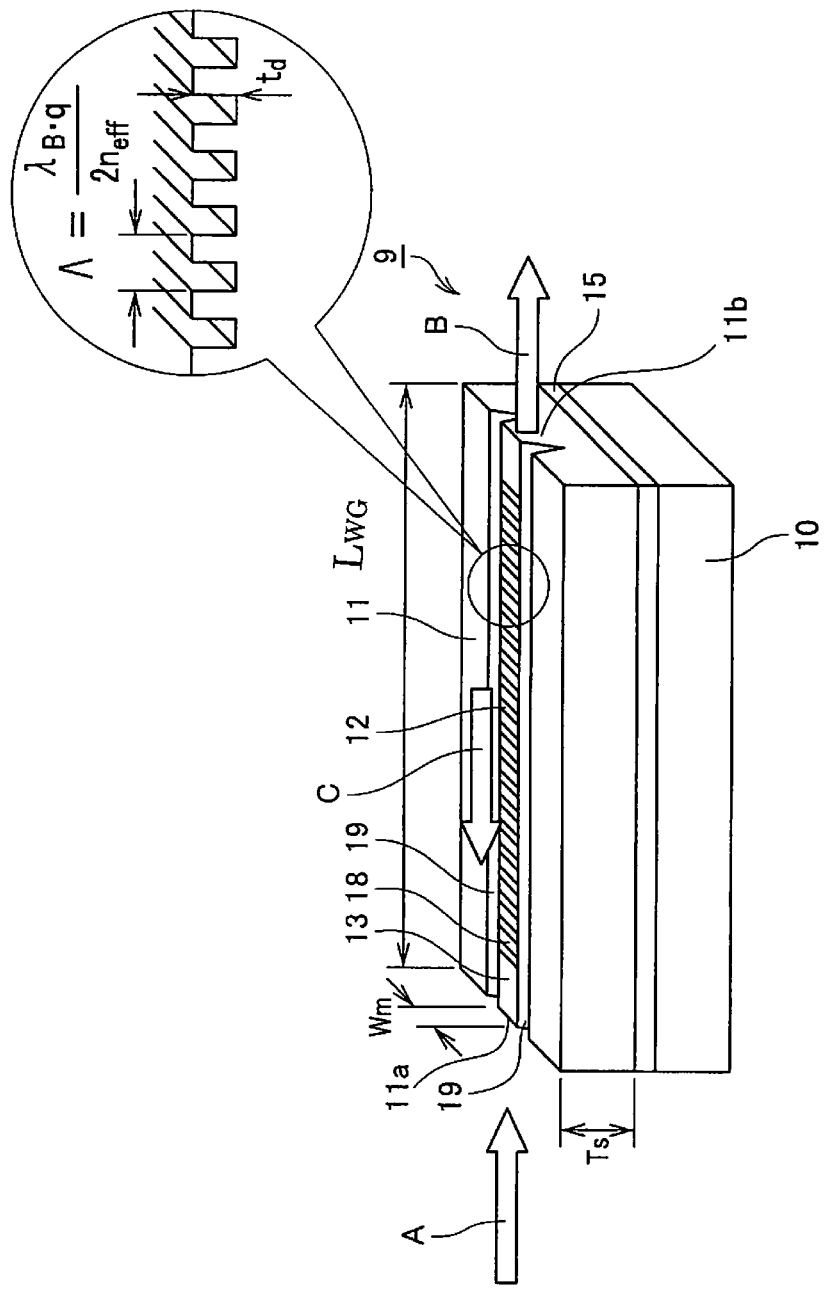
FIG. 3 is a perspective view schematically showing the grating device.

As shown in FIGS. 1 and 3, in the grating device 7, it is provided an optical waveguide 11 including an incident face 11a, to which a semiconductor laser light A is incident, and an emitting face 11b of emitting emission light B of a desired wavelength. C represents reflected light. A Bragg grating 12 is formed in the optical waveguide 11. A propagating portion 13 without a diffraction grating is provided between the incident face 11a of the optical waveguide 11 and the Bragg grating 12, and the propagating portion 13 opposes to the active layer 5 through a spacing 14. 7B represents an antireflection film provided on the side of the incident face of the optical waveguide 11, and 7C represents an antireflection film provided on the side of the emitting face of the optical waveguide 11. According to the present example, the optical waveguide 11 is of a ridge type optical waveguide, and provided on a substrate 10. The optical waveguide 11 may be formed on the same face or on the opposing face as the Bragg grating 12.

According to a preferred embodiment, the reflectance value of the Bragg grating is larger than those at the light emitting end of the light source, at the light incident face of the grating device and at the light emitting face of the grating device. On the viewpoint, the reflectance values at the light emitting end of the light source, at the light incident face of the grating device and at the light emitting end of the grating device may preferably be 0.1 percent or lower. Further, the reflectance of each of the antireflection films 7A, 7B and 7C is smaller than a reflectance value of the Bragg grating, and may preferably be 0.1 percent or lower.

Figure 2:
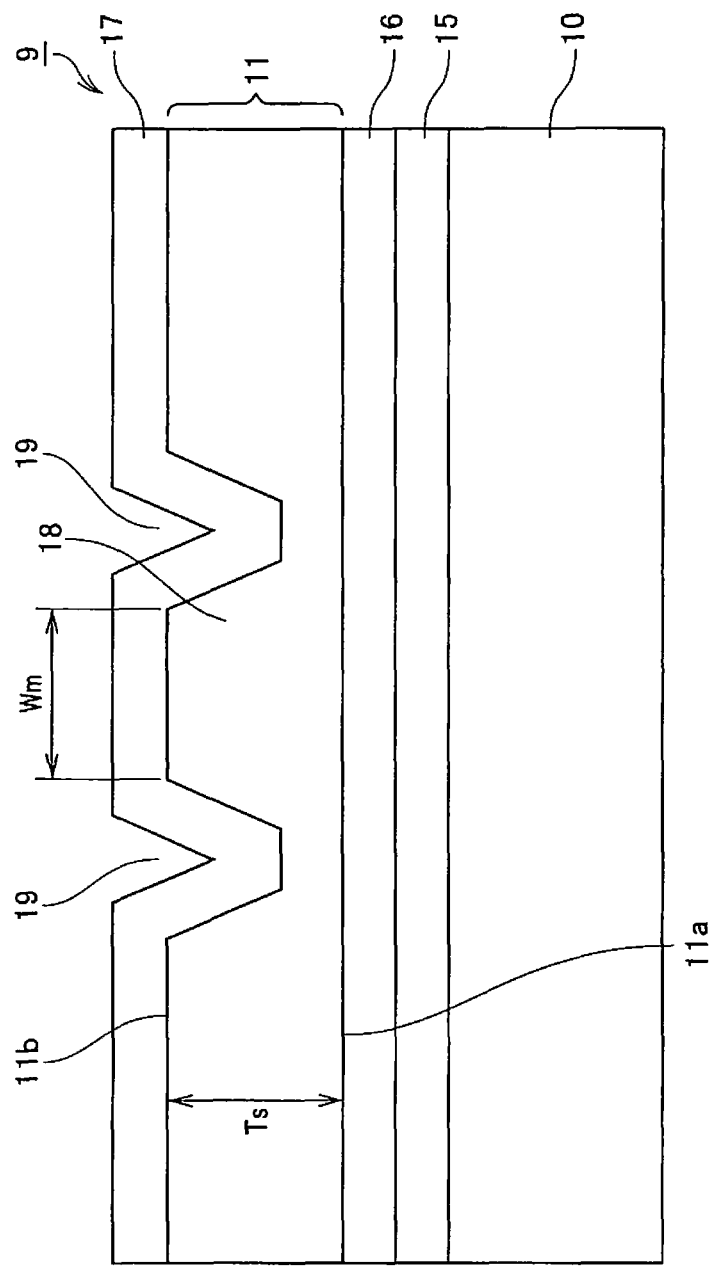
FIG. 2 is a cross sectional view of a grating device.

As shown in FIG. 2, according to the present example, a high refractive index layer 11 is formed on the substrate 10 through an adhesive layer 15 and a lower buffer layer 16, and an upper buffer layer 17 is formed on the high refractive index layer 11. For example, a pair of ridge grooves 19 is formed in the high refractive index layer 11, and a ridge type optical waveguide 18 is formed between the ridge grooves. In this case, the Bragg grating may be formed on a flat face 11a or face 11b. On the viewpoint of reducing deviation of shape of the Bragg grating or ridge groove, the Bragg grating is preferably formed on the face 11a so that the Bragg grating and ridge grooves 19 are provided on the opposite sides of the substrate.

Figure 4:
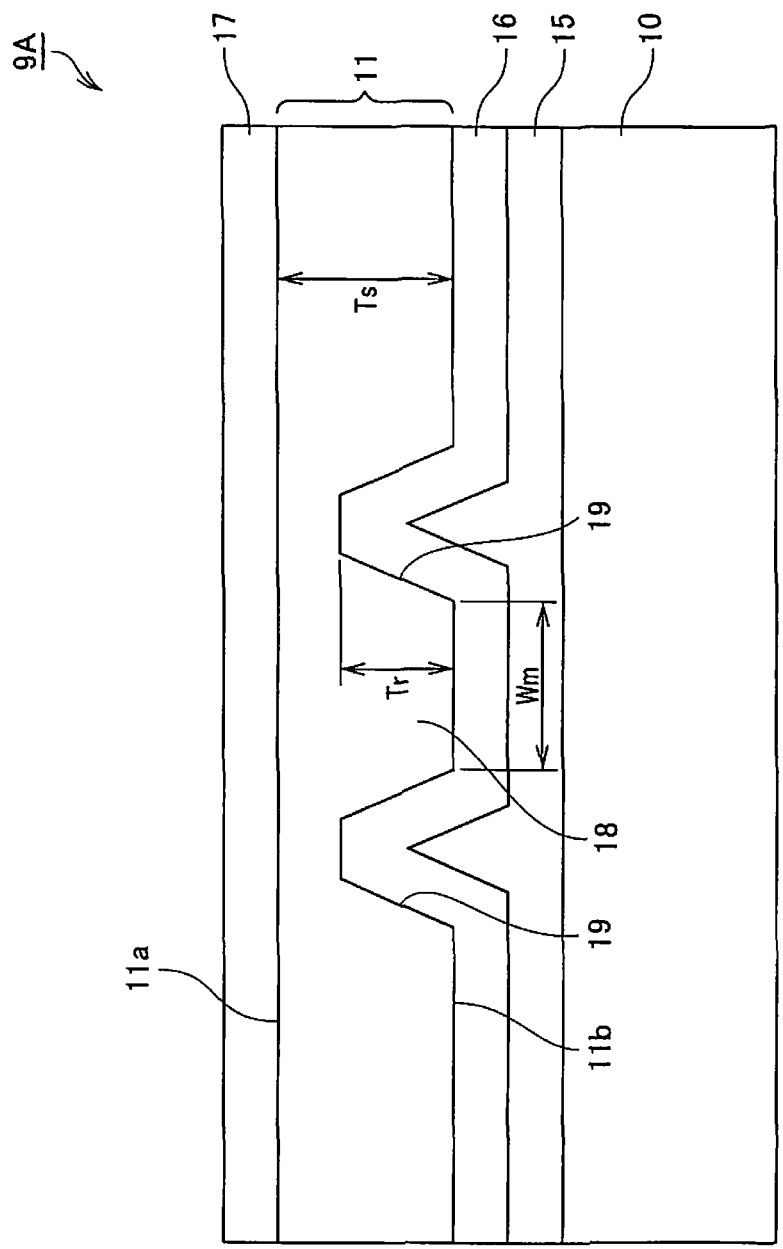
FIG. 4 is a cross sectional view showing another grating device.

Further, according to a device 9A shown in FIG. 4, the high refractive index layer 11 is formed on the substrate 10 through the adhesive layer 15 and lower buffer layer 16, and the upper buffer layer 17 is formed on the high refractive index layer 11. For example a pair of the ridge grooves 19 is formed on the side of the substrate 10 in the high refractive index layer 11, and the ridge type optical waveguide 18 is formed between the ridge grooves 19. In this case, the Bragg grating may be formed on the side of the flat face 11a or on the face 11b with the ridge grooves formed. On the viewpoint of reducing the deviation of shape of the Bragg grating or ridge groove, the Bragg grating may preferably be formed on the side of the flat face 11a so that the Bragg grating and ridge grooves 19 are provided on the opposite sides of the substrate. Further, the upper buffer layer 17 may be omitted, and in this case, air layer can be directly contacted with the grating. It is thus possible to increase a difference of the refractive indices in the cases that the grating groove is present and absent, so that it is possible to make the reflectance larger with the grating having a smaller length.

As the light source, it is preferred a laser of a GaAs series material or InP series material having high reliability. As an application of the inventive structure, for example, in the case that a non-linear optical device is utilized to oscillate green-light laser as a second harmonic wave, it is to be used laser of GaAs series oscillating at a wavelength around 1064 nm. As the reliability of the GaAs series or InP series laser is excellent, it is possible to realize a light source such as a laser array or the like composed of lasers arranged one-dimensionally. It may be used a super luminescence diode or a semiconductor optical amplifier (SOA). Further, the material and wavelength of the active layer may be appropriately selected.

The ridge type optical waveguide may be obtained by physically processing and shaping with, for example, grinding by means of a peripheral cutting edge or laser ablation.

The buffer layer may function as the clad layer for the optical waveguide. On the viewpoint, the refractive index of the buffer layer may preferably be lower than that of the high refractive index layer, and the difference of the refractive indices may preferably be 0.2 or larger and more preferably be 0.4 or larger.

The Bragg grating may be formed by physical or chemical etching as follows.

Specifically, a metal film such as Ni or Ti is formed on the substrate of a high refractive index, and windows are periodically formed by photolithography to form a etching mask. Thereafter, a dry etching system, such as a reactive ion etching system, is utilized to form the grating grooves periodically. At last, the metal mask is removed to form it.

In the high refractive index layer, for further improving the resistance against optical damage of the optical waveguide, it may be contained one or more metals selected from the group consisting of magnesium (Mg), zinc (Zn), scandium (Sc) and indium (In), and in this case, magnesium is most preferred. Further, in the crystal, it may be contained a rare earth element as a dopant. The rare earth element may preferably be Nd, Er, Tm, Ho, Dy or Pr.

The material of the adhesive layer may be an inorganic adhesive, or an organic adhesive, or a combination of the inorganic and organic adhesives.

Further, the high refractive index layer 11 may be formed by a film-forming method on a supporting body. Such film-forming method includes sputtering, vapor deposition or CVD. In this case, the above described adhesive layer is not necessary.

Specific material of the supporting body is not particularly limited, and includes lithium niobate, lithium tantalate, a glass such as quartz glass, quartz, Si or the like.

The reflectance of the antireflective film is necessarily lower than the reflectance of the grating. The material of the film forming the antireflective film includes a film formed by lamination of oxides such as silicon dioxide, tantalum pentoxide or the like and a metal.

Further, the end faces of the light source device and grating device may be cut in an inclined direction for reducing the reflection at the end faces, respectively. Further, although the grating device and supporting body may be joined by fixing by adhesion according to the example of FIG. 2, they may be directly joined with each other.

The meaning of the conditions defined in the formulas (1) to (8) will be further described below.

As mathematical formulas are abstract and difficult to understand, however, typical embodiments of a prior art and the present invention will be directly compared with each other first to describe the characteristics of the present invention. The conditions of the present invention will be then described.

First, condition for oscillating a semiconductor laser is decided on the gain condition and phase condition, as the following formula.

$$(C_{out}^2)^4 |r_1||r_2| \exp\{(\zeta_t g_{th} - \alpha_a) L_a - \alpha_b L_b\} \times \exp\{j(-\phi_1 - \phi_2 - 2\beta L_a)\} = 1 \quad (2\text{-}1)$$

The gain condition is expressed as the following formula from the formula (2-1).

$$\zeta_t g_{th} = \alpha_a L_a + \alpha_b L_b + \frac{1}{L_a} \ln\left(\frac{1}{|r_1||r_2|C_{out}^2}\right) \quad \text{Formula (2-2)}$$

Besides, $\alpha a$ and $\alpha b$ are loss coefficients of the active layer and grating layer, respectively, La and Lb are lengths of the active layer and grating layer, respectively, r1 and r2 are reflectances of a mirror (r2 represents a reflectance of the grating), Cout represents a connection loss of the grating device and light source, $\zeta_t g_{th}$ represents a gain threshold value of a laser medium, $\phi 1$ represents an amount of change of phase due to a reflection mirror on the side of the laser, and $\phi 2$ represents an amount of change of phase in the grating portion.

The formula (2-2) indicates that laser oscillation occurs in the case that the gain $\zeta_t g_{th}$ (gain threshold value) of the laser medium exceeds the loss. The gain curve (dependency on wavelength) of the laser medium provides a full width at half maximum of 50 nm or larger and exhibits broad characteristics. Further, the loss part (right column) shows hardly any dependency on wavelength other than the reflectance of the grating, so that the gain condition is decided on the grating. As a result, as shown in the comparison table, the gain condition can be evaluated only by the grating.

On the other hand, the phase condition is as shown in the following formula from the formula (2-1). However, $\phi 1$ becomes zero.

$$\phi_2 + 2\beta L_a = 2p\pi \ (p \text{ represents an integer}) \quad \text{Formula (2-3)}$$

As to the external resonator type laser, it has been commercialized those utilizing an external resonator including quartz glass optical waveguide or FBG. According to prior design concept, as shown in table 1 and FIGS. 5 and 6, the reflection characteristic of the grating was $\Delta\lambda g$ of about 0.2 nm and a reflectance of 10 percent. The length of the grating portion was thereby made 1 mm. On the other hand, as to the phase condition, the wavelength satisfying it takes discrete values and it is designed so that the formula (2-3) is satisfied at two or three points within $\Delta\lambda g$. It becomes thereby necessary the active layer of the laser medium whose length is large, and it has been used the active layer having a length of 1 mm or larger.

TABLE 1

Figure 10A:
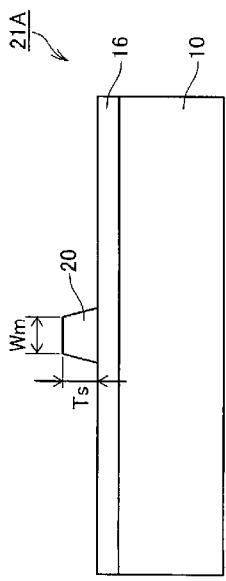
FIGS. 10(a), 10(b) and 10(c) are diagrams schematically showing cross sections of grating devices 21A, 21B and 21C, respectively, utilizing elongate strip-shaped optical waveguides 20, 20A.
Figure 10B:
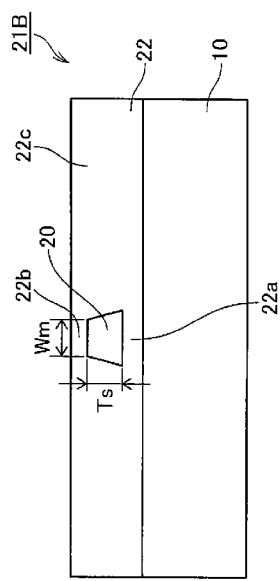
Figure 10C:
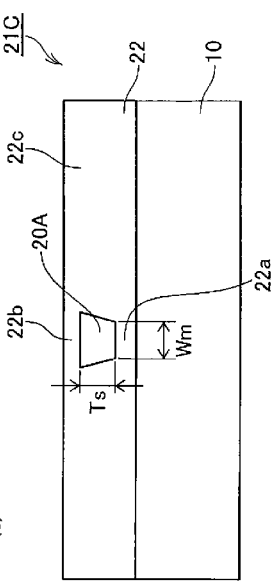
Figure 11A:
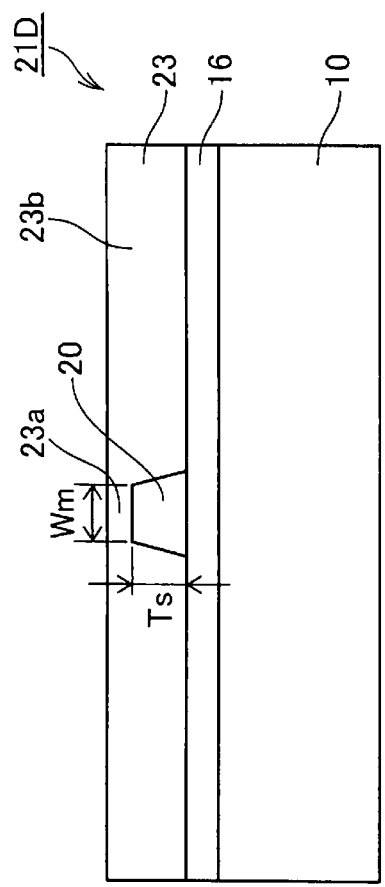
FIGS. 11(a) and 11(b) are diagrams schematically showing grating devices 21D and 21E, respectively, utilizing elongate and stripe-shaped optical waveguides 21D and 21E.
Figure 11B:
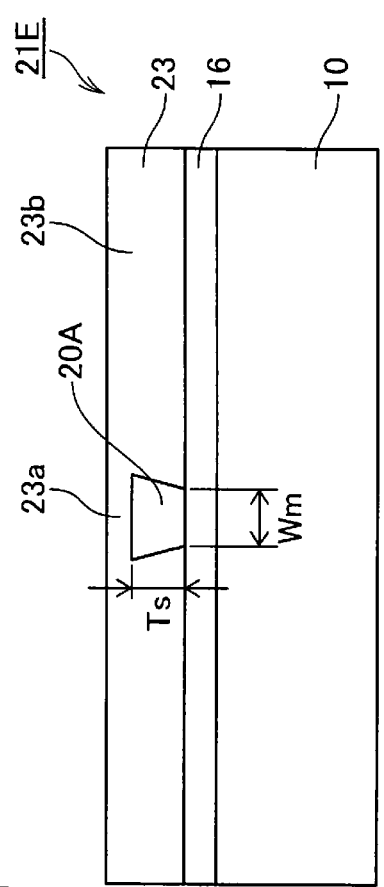

|  | Prior structure | Present invention |
|---|---|---|
| Reflection Characteristics (gain condition) and Phase condition | FIG. 10 | FIG. 11 |
| Material | FBG, glass waveguide | LN (used for ordinary light), GaAs, Ta2O5 ZnO, Al2O3 |
| Length of grating Lb | Comparative Example: 1 mm | Example: 100 μm |
| Length of LD Active layer | Comparative Example: 2.1 mm | Example: 300 μm |
| Mode hopping Temperature (operational temperature range) | Comparative Example; 5° C. | Example: 60° C. |
| Change of wavelength | 0.01 nm/° C. | 0.05 nm/° C. |
| Deviation of power | Deviation of power by mode hopping; 5% or larger | 3% or smaller |
| Notes | Temperature control with Peltier device is needed | Peltier device is not needed |

In the case of a glass waveguide or FBG, the dependency of $\lambda g$ on temperature is very small, and $d\lambda_G/dT$ becomes about 0.01 nm/° C. As a result, the external resonator type laser has the characteristics of stability on wavelength.

Contrary to this, the dependency of the wavelength satisfying the phase condition on temperature is large and $d\lambda_G/dT$ is 0.05 nm/° C., and the difference reaches 0.04 nm/° C.

Generally, the temperature $T_{mh}$ at which the mode hopping takes place can be considered as the following formula based on the non-patent document 1 (It is provided that Ta=Tf).

$\Delta G_{TM}$ is a spacing (longitudinal mode spacing) of the wavelengths satisfying the phase condition of the external resonator type laser.

$$T_{mh} = \frac{\Delta G_{TM}}{\left|\frac{d\lambda_G}{dT} - \frac{d\lambda_{TM}}{dT}\right|} \quad \text{Formula (2-4)}$$

As a result, $T_{mh}$ becomes about 5° C. according to a prior art, so that it is susceptible to the mode hopping. In the case that the mode hopping occurs, the power is deviated based on the reflection characteristics of the grating by 5 percent or more.

As described above, in actual operation, a Pertier device has been used to perform temperature control in the prior external resonator type laser utilizing the glass waveguide or FBG.

Figure 7:
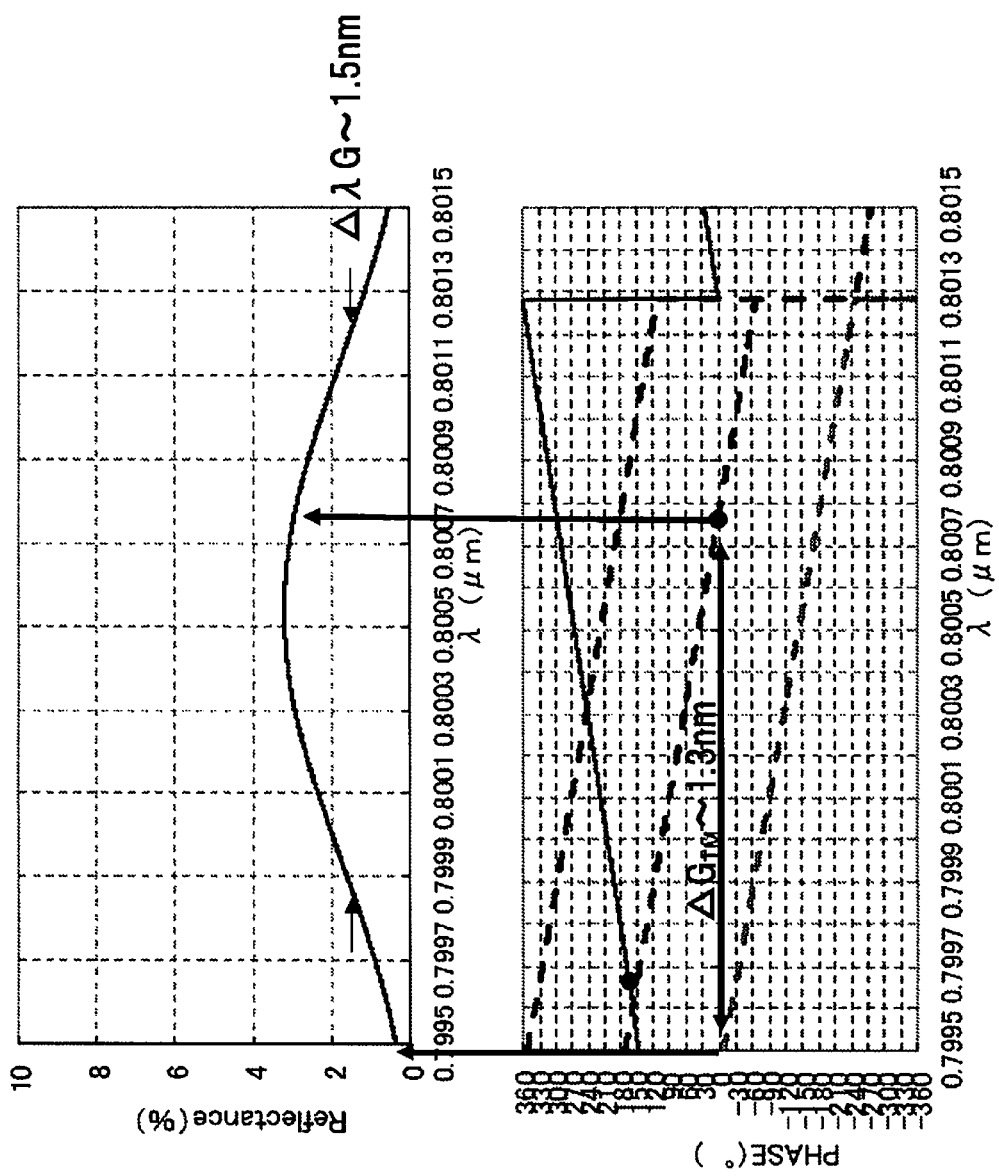
FIG. 7 is a diagram for illustrating pattern of mode hopping according to the inventive example.
Figure 8:
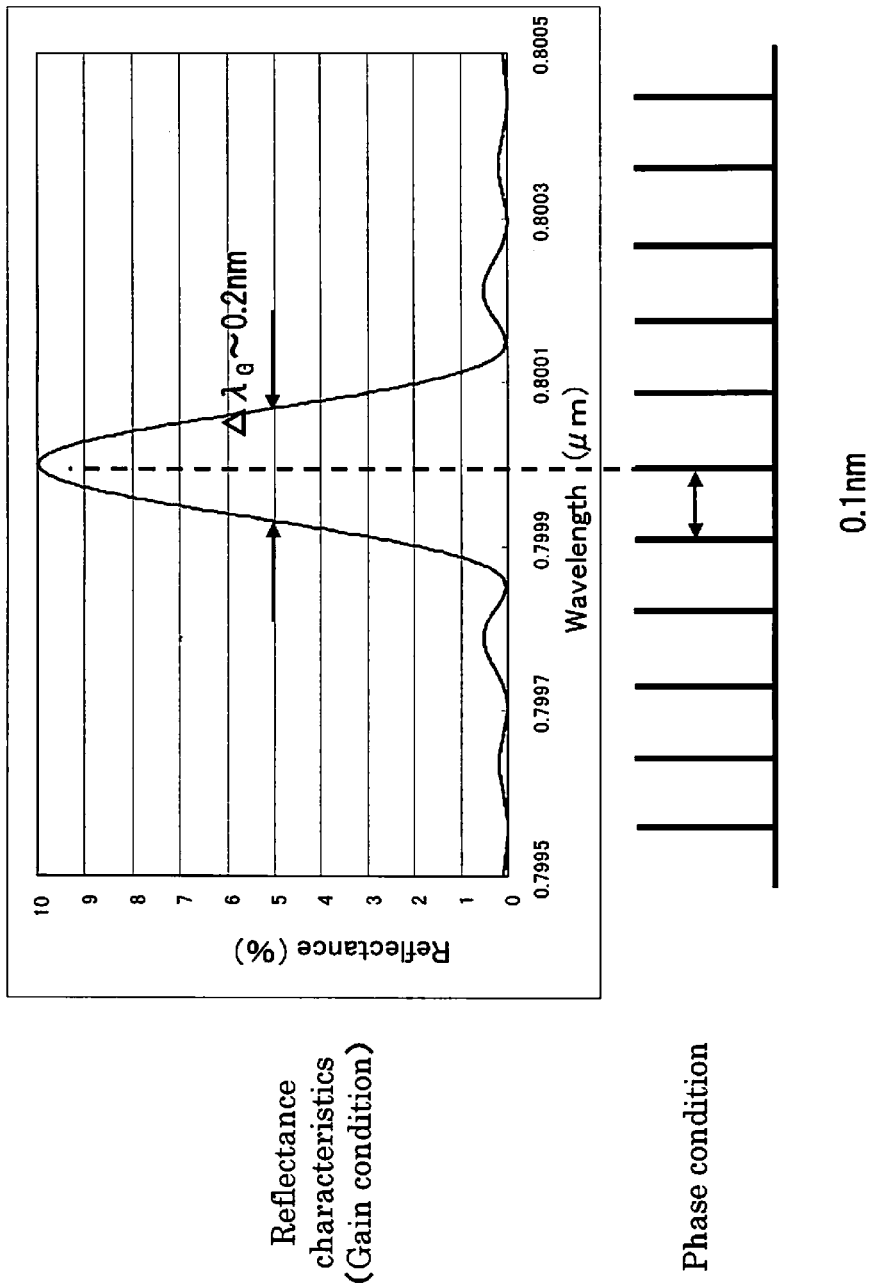
FIG. 8 shows reflection characteristics (gain condition) and phase condition in a prior structure.
Figure 9:
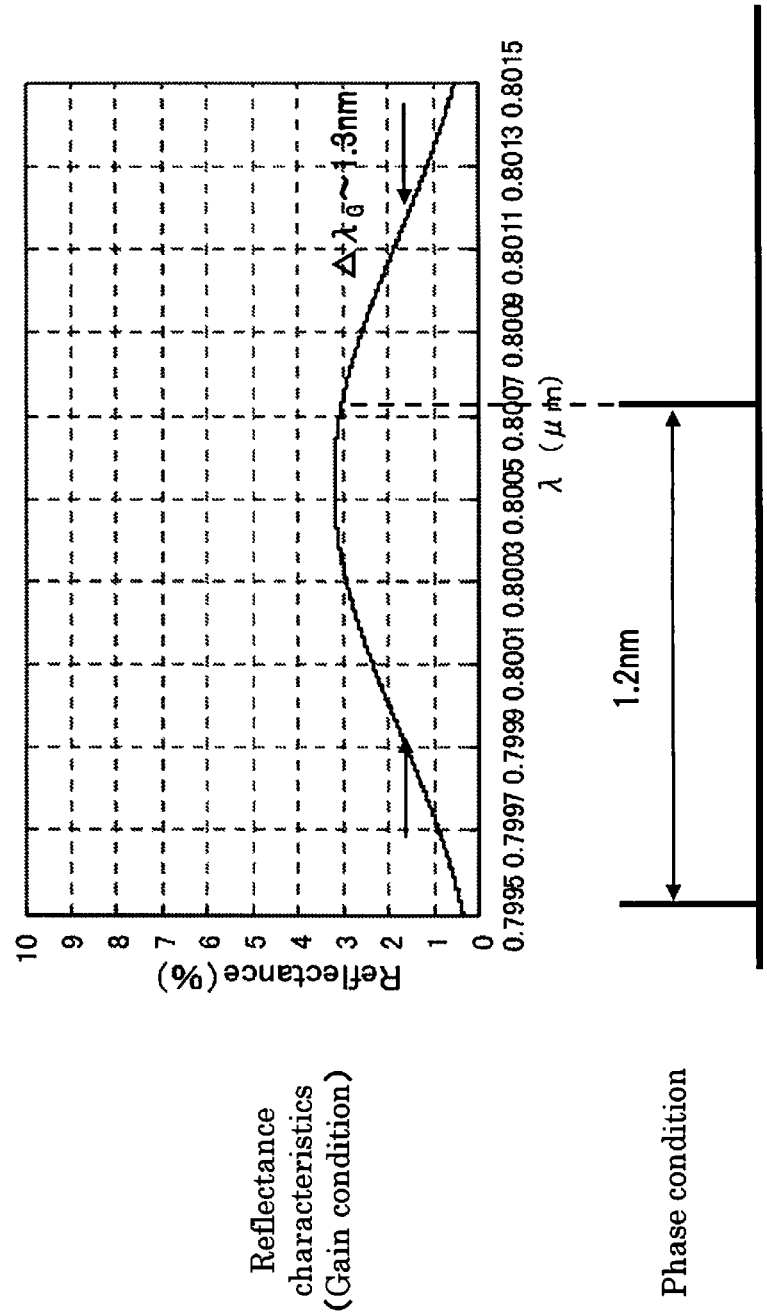
FIG. 9 shows reflection characteristics (gain condition) and phase condition in a structure of the invention.

Contrary to this, the present invention utilizes the grating device in which the denominator of the formula (2-4)

becomes small as a precondition. It is needed that the denominator of the formula (2-4) is made 0.03 nm/° C. or lower, and specific material may preferably be gallium arsenide (GaAs), lithium niobate (LiNbO$_3$), tantalum oxide (Ta$_2$O$_5$), zinc oxide (ZnO), or aluminum oxide (Al$_2$O$_3$). For example, in the case that lithium niobate (ordinary light) is used, that $\Delta\lambda_G$ is designed at about 1.3 nm and that the length of the active layer is made 250 μm for making two wavelengths satisfying the phase condition are present within $\Delta\lambda_G$, $\Delta G_{TM}$ becomes 1.2 nm and $T_{mh}$ becomes 60° C. for example, so that it is possible to enlarge the operational temperature range. FIG. 7 shows this example.

That is, according to the inventive structure, although the oscillating wavelength is changed at 0.05 nm/° C. based on the temperature characteristics of the grating with respect to the temperature change, it is possible to make the mode hopping difficult to take place. According to the inventive structure, the length Lb of the grating is made 100 μm for enlarging $\Delta\lambda_G$, and La is made 250 μm for enlarging $\Delta G_{TM}$.

Besides, the difference over the non-patent document 6 is supplemented.

The present invention is to realize the non-dependency on temperature by making the temperature coefficient of the wavelength of the grating closer to the temperature coefficient of the longitudinal mode, so that it is possible to make the resonator structure compact without the necessity of an additional part. According to the patent document 6, each parameter is described as follows, which is within a range of a prior art.

$\Delta\lambda_G$=0.4 nm

Spacing of longitudinal mode $\Delta G_{TM}$=0.2 nm

Length of grating Lb=3 mm

Length of LD active layer=600 μm

Length of propagating portion=1.5 mm

Each condition of the present invention will be described further below.

Figure 5:
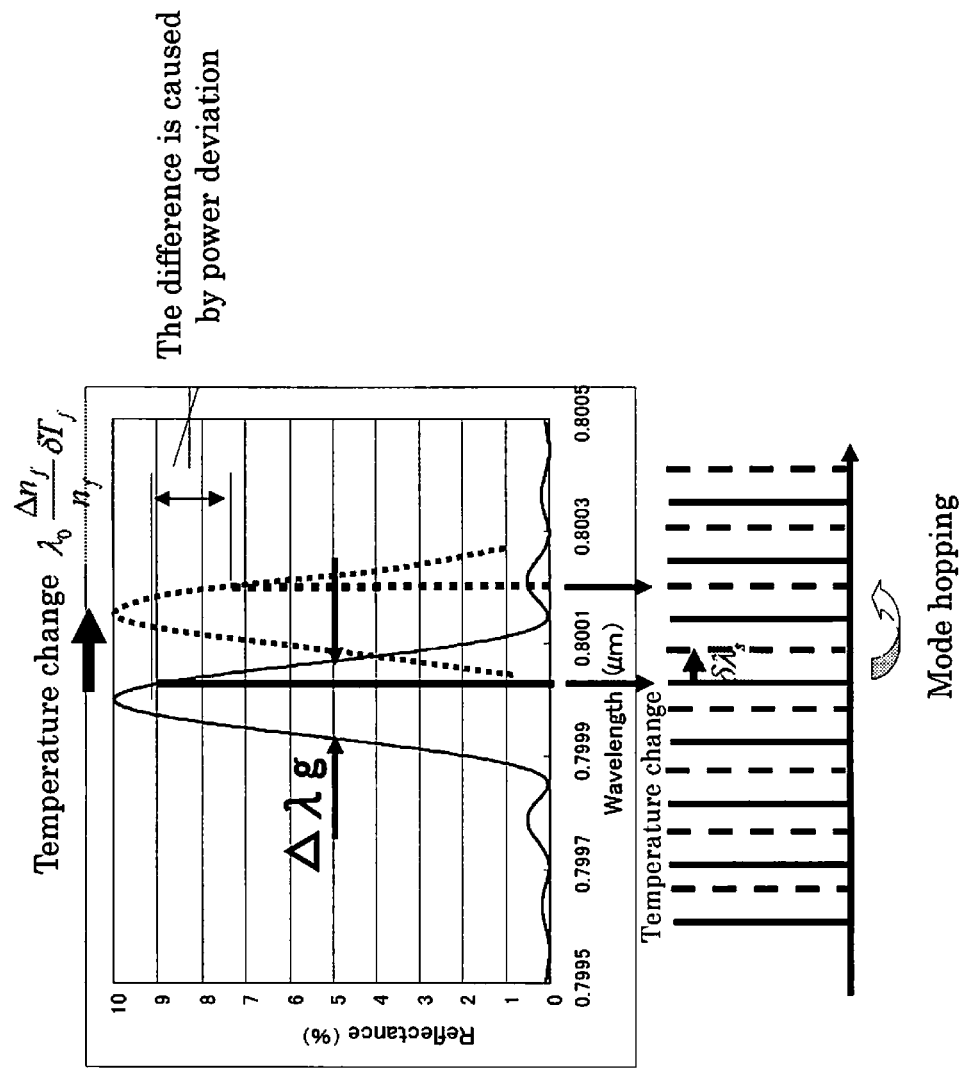
FIG. 5 is a diagram for illustrating pattern of mode hopping according to a prior art.
Figure 6:
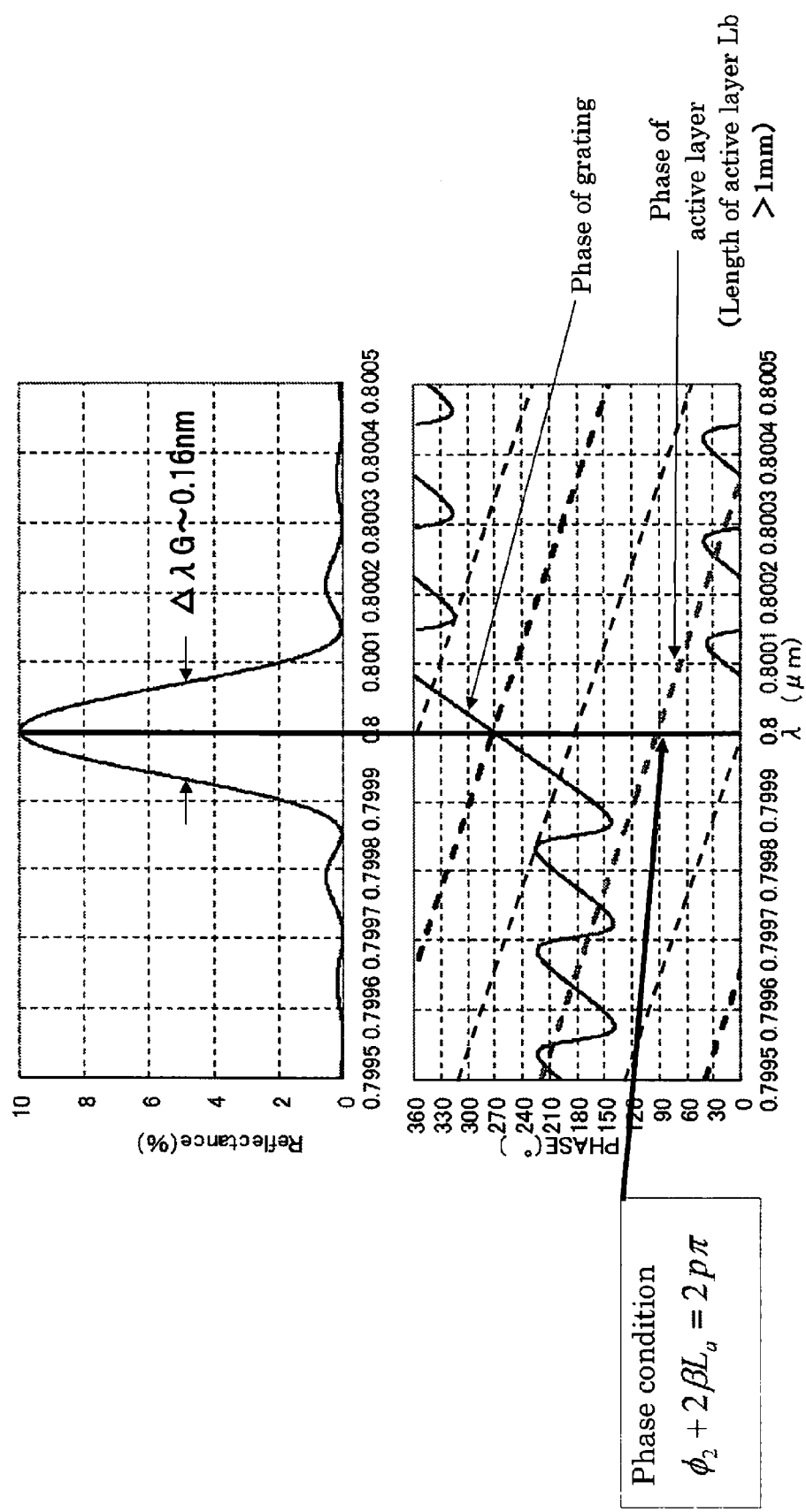
FIG. 6 is a diagram for illustrating pattern of mode hopping according to a prior art.

The full width at half maximum $\Delta\lambda_G$ in a peak of Bragg reflectance is made 0.8 nm or higher (formula 1). $\lambda_G$ represents Bragg wavelength. That is, as shown in FIGS. 5, 6 and 7, in the case that the horizontal axis is assigned to the reflection wavelength by the Bragg grating and the vertical axis is assigned to the reflectance, the wavelength at which the reflectance takes the maximum is assigned to the Bragg wavelength. Further, in the peak whose center is positioned at the Bragg wavelength, a difference of two wavelengths at which the reflectance takes a half of the peak maximum is assigned to a full width at half maximum $\Delta\lambda_G$.

The full width at half maximum $\Delta\lambda_G$ at the peak of the Bragg reflectance is made 0.8 nm or larger so that the peak of the reflectance is made broad as shown in FIG. 7. On the viewpoint, the full width at half maximum $\Delta\lambda_G$ may preferably be made 1.2 nm or larger and more preferably be made 1.5 nm or larger. Further, full width at half maximum $\Delta\lambda_G$ may preferably be made 2 nm or smaller.

The length Lb of the Bragg grating is made 500 μm or smaller (formula 2). The length Lb of the Bragg grating is a length of the grating in the direction of an optical axis of light propagating in the optical waveguide. It is a precondition of the inventive design concept to shorten the length Lb of the Bragg grating to 500 μm or smaller, which is shorter than that in a prior art. On the viewpoint, the length Lb of the Bragg grating may preferably be made 300 μm or smaller.

The length La of the active layer is also made 500 μm or smaller (formula 3). It is also a precondition of the inventive design concept to shorten the length La of the active layer than that in a prior art. On the viewpoint, the length La of the active layer may preferably be made 300 μm or smaller. Further, the length La of the active layer may preferably be made 150 μm or larger.

The refractive index $n_b$ of a material forming the Bragg grating is made 1.8 or higher (formula 4). According to a prior art, it has been generally used a material having a lower refractive index such as quartz. According to the concept of the present invention, the refractive index of the material forming the Bragg grating is made higher. The reason is that the material having a larger refractive index provides a larger dependency of the refractive index on temperature, and that $T_{mh}$ of the formula (2-4) can be made larger. On the viewpoint, $n_b$ may more preferably be 1.9 or higher. Further, although the upper limit of $n_b$ is not particularly defined, it may preferably be 4 or lower because the formation of the grating may be difficult in the case that the grating pitch is too small.

In addition to this, the condition defined in the formula (5) is important.

In the formula (5), $d\lambda_G/dT$ represents a temperature coefficient of the Bragg wavelength.

Further, $d\lambda_{TM}/dT$ represents a temperature coefficient of wavelength satisfying the phase condition of the external resonator laser.

Here, $\lambda_{TM}$ represents a wavelength satisfying the phase condition of the external resonator laser, that is, the wavelength satisfying the phase condition of the formula (2-3) as described above. This is called "longitudinal mode" in the specification.

The longitudinal mode will be supplemented below.

Since $\phi 2+2\beta La=2p\pi$ and $\beta=2\pi/\lambda$ according to the formula (2-3), $\lambda$ satisfying them is assigned to $\Delta_{TM}$. $\phi 2$ represents a change of phase of the Bragg grating, and is calculated according to the following formula.

$$r_2 = \frac{-j\kappa\tanh(\gamma L_b)}{\gamma + (\alpha/2 + j\delta)\tanh(\gamma L_b)} \equiv |r_2|\exp(-j\phi)$$

$\Delta G_{TM}$ represents a spacing (longitudinal mode spacing) of the wavelengths satisfying the phase condition of the external resonator laser. Since a plurality of $\lambda_{TM}$ are present, it means a difference of a plurality of $\lambda_{TM}$.

Therefore, by satisfying the formula (5), it is possible to make the temperature of mode hopping higher to prevent the mode hopping in a practical view. The numerical value of the formula (5) may more preferably be made 0.025 or lower.

The length $L_{WG}$ of the grating device is made 600 μm or smaller (formula 6). It is also a precondition of the present invention to shorten it as Lb. On the viewpoint, $L_{WG}$ may preferably be 400 μm or smaller and more preferably be 300 μm or smaller. Further, $L_{WG}$ may preferably be 50 μm or larger.

The distance Lg between the emitting face of the light source and incident face of the optical waveguide is made 1 μm or larger and 10 μm or smaller (formula 7). The stable oscillation can thereby be realized.

The length Lm of the propagation portion is made 20 μm or larger and 100 μm or smaller (formula 8). The stable oscillation can thereby be realized.

According to a preferred embodiment, the light source and grating device are directly and optical coupled to each other, the Bragg grating and the outer end face opposite to the emitting face of the active layer constitute a resonator structure, and a length between the outer side end face of the active layer and the end point on emitting side of the Bragg grating is 900 µm or smaller. As light is gradually reflected in the grating portion, it is not possible to observe the reflection point clearly as a reflective mirror. Although the effective reflection point can be mathematically defined, it is present on the side of the laser with respect to the end point of the Bragg grating on the emitting side. Considering this, according to the present invention, the length of the resonator is defined at the end point on the emitting side. According to the present invention, even when the length of the resonator is very short, it is possible to oscillate light of a target wavelength at a high efficiency. On the viewpoint, the length between the outer side end face of the active layer and the end point of the Bragg grating on the emitting side may preferably be 800 µm or smaller and more preferably be 700 µm or smaller. Further, on the viewpoint of improving the output of the laser, the length of the resonator may preferably be 300 µm or larger.

According to each of the examples described above, the optical waveguide is a ridge type optical waveguide including a ridge portion and at least a pair of ridge grooves defining the ridge portion. In this case, a high-refractive index material is left under the ridge grooves, and elongated portions of the high-refractive index material are also left in the outside of the ridge grooves, respectively.

However, in the ridge type optical waveguide, it is possible to form an elongate and stripe-shaped core, by removing the high-refractive index material under the ridge grooves. In this case, the ridge type optical waveguide is composed of an elongate core of an optical material, and the cross section of the core is defined by a convex shape. A buffer layer (clad layer) or air layer is present around the core and functions as a clad.

The convex shape means that line segments each connecting optional two points on an outer profile line of the cross section of the core are present inside of the outer profile line of the cross section of the core. Such figure includes polygons such as triangle, quadrilateral, hexagon. heptagon or the like, circle, ellipse or the like. Quadrilateral may preferably be that having an upper side, a lower side and a pair of side lines, and more preferably be trapezoid.

FIGS. 10 and 11 relate to this embodiment.

According to a grating device 21A of FIG. 10(a), a buffer layer 16 is formed on a supporting substrate 10, and an optical waveguide 20 is formed on the buffer layer 16. The optical waveguide 20 is composed of a core composed of the high refractive index-material having a refractive index of 1.8 or higher. The shape of the cross section (cross section in the direction perpendicular to the propagating direction of light) of the optical waveguide is trapezoid, and the optical waveguide is extended and elongated. According to the present example, the upper side face of the optical waveguide 20 is narrower than the lower side face. The incident side propagating portion, Bragg grating and emitting side propagating portion as described above are formed in the optical waveguide 20.

According to a grating device 21B of FIG. 10(b), a buffer layer 22 is formed on the supporting substrate 10, and the optical waveguide 20 is embedded inside of the buffer layer 22. The shape of the cross section (cross section in the direction perpendicular to the propagating direction of light) of the optical waveguide is trapezoid, and the optical waveguide is extended and elongated. According to the present example, the upper side face is narrower than the lower side face of the optical waveguide 20. The buffer layer 22 includes an upper side buffer 22b and a lower side buffer 22b of the optical waveguide 20 and side face buffers 22c covering side faces of the optical waveguide 20.

According to a grating device 21C of FIG. 10(c), a buffer layer 22 is formed on the supporting substrate 10, and the optical waveguide 20A is embedded inside of the buffer layer 22. The optical waveguide 20A is composed of the core composed of the high refractive index-material having a refractive index of 1.8 or higher. The shape of the cross section (cross section in the direction perpendicular to the propagating direction of light) of the optical waveguide is trapezoid, and the optical waveguide is extended and elongated. According to the present example, the lower side face of the optical waveguide 20 is narrower than the upper side face.

According to a grating device 21D of FIG. 11(d), a buffer layer 16 is formed on the supporting substrate 10, and the optical waveguide 20 is formed on the buffer layer 16. Then, the optical waveguide 20 is surrounded by and embedded in another buffer layer 23. The buffer layer 23 includes an upper side buffer 23a and side face buffers 23b. According to the present example, the upper side face of the optical waveguide 20 is narrower than the lower side face.

According to a grating device 21E of FIG. 11(e), a buffer layer 16 is formed on the supporting substrate 10, and the optical waveguide 20A is formed on the buffer layer 16. Then, the optical waveguide 20A is surrounded by and embedded in another buffer layer 23. The buffer layer 23 includes an upper side buffer 23a and side face buffers 23b. According to the present example, the lower side face of the optical waveguide 20 is narrower than the upper side face.

Then, the width Wm of the optical waveguide is defined as a width of the narrowest part in the cross section of the optical waveguide.

EXAMPLES

Inventive Example 1

It was fabricated the system shown in FIGS. 1 to 3.

Specifically, Ni film was formed on a substrate composed of z-plate of lithium niobate crystal doped with MgO, and photolithography technique was utilized to produce grating pattern in the direction of y-axis. Thereafter, reactive ion etching was performed using the Ni pattern as a mask to form grating grooves at a pitch spacing Λ of 180 nm and a length Lb of 100 µm. The depth of the grating groove was 300 nm. Further, for forming the optical waveguide for propagation in y-axis, the grooves each having a width Wm of 3 µm and Tr of 0.5 µm were processed in the grating portion by means of excimer laser. Further, the buffer layer 17 made of $SiO_2$ and of 0.5 µm was formed by a sputtering system on the face with the grooves formed thereon, and a black LN substrate was used as the supporting body to adhere the face with the grating formed thereon.

Then, the black LN substrate was adhered onto a polishing surface plate and the back face of the LN substrate with the grating was subjected to precision polishing to a thickness (Ts) of 1 µm. Thereafter, it was removed off from the surface plate and the buffer layer 16 composed of $SiO_2$ and of 0.5 µm was formed on the polished face by sputtering.

Thereafter, the assembly was cut into bars by means of a dicing equipment and both end faces of the bar were subjected to optical polishing. AR coatings of 0.1% or lower were formed on the both end faces, respectively, and the bar was cut into chips to produce the grating devices. The size of the device was a width of 1 mm and a length $L_{WG}$ of 500 µm.

As to the optical characteristics of the grating device, a super luminescence diode (SLD), a light source for wide band wavelength, was used to input light into the grating device and its output light was analyzed by an optical spectrum analyzer to evaluate the reflection characteristics based on the transmitting characteristics. As a result, it was obtained the characteristics that the central wavelength was 800 nm, maximum reflectance was 3 percent and full width at half maximum ΔλG was 1.3 nm with respect to polarized light (ordinary light) in the direction of x axis.

Then, for evaluating the characteristics of the external resonator laser utilizing the grating device, the laser module was mounted as shown in FIG. 1. As the light source device, it was prepared one having a GaAs series laser structure, in which a high refractive index film was provided on its one end face and an AR coating of a reflectance of 0.1% was provided on the other end face.

Specification of the light source device:
Central wavelength; 800 nm
Length of laser device; 250 μm
Specification of mounting
Lg: 3 μm
Lm; 20 μm After mounting the module, the device was driven under current control (ACC) without utilizing a Peltier device to obtain the laser characteristics of a central wavelength of 800 nm and an output power of 50 mW. Further, the module was set in a thermostatic bath for evaluating the operational temperature range to measure the temperature dependency of the laser oscillating wavelength, the temperature with the mode hopping occurred and the deviation of output power. As a result, the temperature coefficient of the oscillating wavelength was 0.05 nm/° C., the temperature of the mode hopping was 60° C., and the deviation of the output power was within 1 percent (FIGS. 5 and 7).

Comparative Example

As the Inventive Example 1, Ni film was formed on a substrate composed of z-plate of lithium niobate crystal doped with MgO, and photolithography technique was utilized to produce grating pattern in the direction of y-axis. Thereafter, reactive ion etching was performed using the Ni pattern as a mask to form grating grooves at a pitch spacing Λ of 180 nm and a length Lb of 1000 μm. The depth of the grating grooves was 300 nm. Further, for forming the optical waveguide for propagation in y-axis, the grooves each having a width Wm of 3 μm and Tr of 0.5 μm were processed in the grating portion by means of excimer laser.

Further, the buffer layer 17 made of $SiO_2$ and of 0.5 μm was formed by a sputtering system on the side with the grooves formed thereon, and a black LN substrate was used as the supporting body to adhere the face with the grating formed thereon.

Then, the black LN substrate was adhered onto a polishing surface plate and the back face of the LN substrate with the grating was subjected to precision polishing to a thickness (Ts) of 1 μm. Thereafter, it was removed off from the surface plate and the buffer layer 16 composed of $SiO_2$ and of 0.5 μm was formed on the polished face by sputtering. Thereafter, the assembly was cut into bars by means of a dicing equipment and both end faces of the bar were subjected to optical polishing. AR coatings of 0.1% or lower were formed on the both end faces, respectively, and the bar was cut into chips to produce the grating devices. The size of the device was a width of 1 mm and a length $L_{WG}$ of 1500 μm.

As to the optical characteristics of the grating device, a super luminescence diode (SLD), a light source for wide band wavelength, was used to input light into the grating device and its output light was analyzed by an optical spectrum analyzer to evaluate the reflection characteristics based on the transmitting characteristics. As a result, it was obtained the characteristics that the central wavelength was 800 nm, maximum reflectance was 10 percent and full-width at half maximum ΔλG was 0.2 nm with respect to polarized light (ordinary light) in the direction of x axis.

Then, for evaluating the characteristics of the external resonator laser utilizing the grating device, the laser module was mounted as shown in a separate figure. As the light source device, it was prepared one having a GaAs series laser structure, in which a high refractive index film was provided on its one end face and an AR coating of a reflectance of 0.1% was provided on the other end face.

Specification of the light source device:
Central wavelength; 800 nm
Length of laser device; 1000 μm
Specification of mounting
Lg: 3 μm
Lm; 20 μm After mounting the module, the device was driven under current control (ACC) without utilizing a Pertier device to obtain the laser characteristics of a central wavelength of 800 nm and an output power of 50 mW. Further, the module was set in a thermostatic bath for evaluating the operational temperature range to measure the temperature dependency of the laser oscillating wavelength, the temperature with the mode hopping occurred and the deviation of output power. As a result, the temperature coefficient of the oscillating wavelength was 0.05 nm/° C., the temperature of the mode hopping was 6° C., and the deviation of the output power was 10 percent.

Inventive Example 2

The system shown in FIGS. 1 and 3 was fabricated according to the same procedure as the Inventive Example 1. However, the cross sectional shape of the grating device 21D was made as shown in FIG. 11(*a*).

Specifically, 0.5 μm of an $SiO_2$ layer 16 forming the lower clad layer was formed on a supporting substrate 10 made of quartz by a sputtering system, and 1.2 μm of $Ta_2O_5$ was formed thereon to provide the high refractive index layer. Then, Ti film was formed on the Ta2O5 and the grating pattern was formed by utilizing an EB drawing system. Thereafter, utilizing the Ti pattern as a mask, by fluorine-based reactive ion etching, it was formed the Bragg grating having a pitch distance λ of 238.5 nm and a length Lb of 100 μm. The depth td of the grooves was made 40 nm.

Further, for forming the optical waveguide 20, the reactive ion etching was performed according to the same procedure as described above. The high refractive index layer was etched so that the layer was completely cut through to leave the optical waveguide 20 having a width of 3 μm. The thickness Ts of the optical waveguide 20 was 1.2 μm.

Finally, 2 μm of the buffer layer 23 made of SiO2 and providing the upper clad was formed by sputtering to cover the optical waveguide 20.

Thereafter, the assembly was cut into bars by means of a dicing equipment and both end faces of the bar were subjected to optical polishing. AR coatings of 0.1% were formed on the both end faces, respectively, and the bar was cut into chips to produce the grating devices. The size of the device was a width of 1 mm and a length $L_{WG}$ of 500 μm.

As to the optical characteristics of the grating device, a super luminescence diode (SLD), a light source for wide band wavelength, was used to input light of TE mode into the grating device and its output light was analyzed by an optical spectrum analyzer to evaluate the reflection characteristics based on the transmitting characteristics.

It was obtained the characteristics of the measured grating devices that the central wavelength was 975 nm, maximum reflectance was 18 percent and full width at half maximum $\Delta\lambda_G$ was 2 nm.

Then, the laser module was mounted as shown in FIG. 1. As the light source device, it was prepared a conventional GaAs series laser whose emitting end face was not covered with an AR coating.

Specification of the light source device:
Central wavelength; 977 nm
Output power: 50 mW
Half value width: 0.1 nm
Length of laser device; 250 μm
Specification of mounting
Lg: 1 μm
Lm; 20 μm After mounting the module, the device was driven under current control (ACC) without utilizing a Peltier device. It was obtained the laser characteristics that light was oscillated at a central wavelength of 975 nm, corresponding to the reflection wavelength of the grating, and the output power was 40 mW which was lower than that without the grating device. Further, the module was set in a thermostatic bath for evaluating the operational temperature range to measure the temperature dependency of the laser oscillating wavelength and the deviation of output power. As a result, the temperature coefficient of the oscillating wavelength was 0.03 nm/° C., the temperature range with the large deviation of output power due to mode hopping was 40° C., and the deviation of the output power within the temperature range was within 1 percent in the case that mode hopping occurred.

The invention claimed is:

1. An external resonator type light emitting system comprising a light source oscillating a semiconductor laser light and a grating device providing an external resonator with said light source;
   wherein said light source comprises an active layer oscillating said semiconductor laser light;
   wherein said grating device comprises an optical waveguide comprising an incident face to which said semiconductor laser light is incident and an emitting face of emitting an emitting light of single mode and having a desired wavelength, a Bragg grating formed in said optical waveguide, and a propagating portion provided between said incident face and said Bragg grating;
   wherein said optical waveguide comprises a core;
   wherein a cross section of said core is of a convex shape; and
   wherein the following formulas (1) to (5) are satisfied:

(1) $\Delta\lambda_G \geq 0.8$ nm (2) $L_b \leq 500$ μm (3) $L_a \leq 500$ μm (4) $n_b \geq 1.8$ nm (5) $|(d\lambda_G/dT) - (d\lambda_{TM}/dT)| \leq 0.03$ nm / ° C.; wherein $\Delta\lambda_G$ represents a full width at half maximum of a peak of a Bragg reflectance in said formula (1);
$L_b$ represents a length of said Bragg grating in said formula (2);
$L_a$ represents a length of said active layer in said formula (3); and
$n_b$ represents a refractive index of a material forming said Bragg grating in said formula (4);
$d\lambda_G/dT$ represents a temperature coefficient of a Bragg wavelength in said formula (5); and
$d\lambda_{TM}/dT$ represents a temperature coefficient of a wavelength satisfying a phase condition of an external resonator laser in said formula (5).

2. The system of claim 1, wherein said light source and said grating device are optically and directly connected to each other;
   wherein said external resonator is constituted between said Bragg grating and an outer side end face of said active layer on the opposite side to an emitting face of said active layer; and
   wherein a length between said outer side end face of said active layer and an emitting side end point of said Bragg grating is 900 μm or smaller.

3. The system of claim 2, wherein a length between said outer side end face of said active layer and said emitting side end point of said Bragg grating is 700 μm or smaller.

4. The system of claim 1, further comprising a buffer layer contacting said core, wherein a refractive index of said buffer layer is lower than a refractive index of said core by 0.2 or more.

5. The system of claim 4, wherein said core is embedded in said buffer layer.

6. The system of claim 1, further comprising a common substrate, wherein said light source and said grating device are mounted on said common substrate.

7. The system of claim 1, wherein the following formulas (6) to (8) are satisfied:

$L_{WG} \leq 600$ μm (6)

$1$ μm $\leq L_g 10$ μm (7)

$20$ μm $\leq L_m \leq 100$ μm; (8)

wherein
$L_{WG}$ represents a length of said grating device in said formula (6);
$L_g$ represents a distance between an emitting face of said light source and said incident face of the optical waveguide layer in said formula (7) ; and
$L_m$ represent a length of said propagating portion in said formula (8).

8. The system of claim 1, wherein a reflectance of said Bragg grating is higher than each of reflectances at an emitting end of said light source, at said incident face of said grating device and at said emitting face of said grating device.

9. The system of claim 1, wherein said Bragg grating comprises a material that is selected from the group consisting of gallium arsenide, lithium niobate single crystal, tantalum oxide, zinc oxide and aluminum oxide.

10. The system of claim 1, further comprising a buffer layer provided on said optical waveguide.

11. The system of claim 1, wherein said length $L_b$ of said Bragg grating is 300 μm or smaller; and wherein said length $L_a$ of said active layer is 300 μm or smaller.

12. The system of claim 1, wherein said light source comprises a GaAs-based laser or an InP-based laser.

* * * * *